United States Patent
Kojima

(10) Patent No.: US 7,154,152 B2
(45) Date of Patent: Dec. 26, 2006

(54) SEMICONDUCTOR DEVICE

(75) Inventor: Toshiaki Kojima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 187 days.

(21) Appl. No.: 10/792,812

(22) Filed: Mar. 5, 2004

(65) Prior Publication Data
US 2004/0178455 A1 Sep. 16, 2004

(30) Foreign Application Priority Data
Mar. 14, 2003 (JP) ............... 2003-069044

(51) Int. Cl.
*H01L 23/62* (2006.01)
(52) U.S. Cl. ............ 257/358; 257/355; 257/356; 257/173; 257/E27.052; 438/133
(58) Field of Classification Search ........ 257/355, 257/356, 173, 358
See application file for complete search history.

(56) References Cited

U.S. PATENT DOCUMENTS

| | | | |
|---|---|---|---|
| 5,502,317 A | | 3/1996 | Duvvury |
| 5,856,214 A * | | 1/1999 | Yu .............. 438/133 |
| 5,982,601 A * | | 11/1999 | Lin ............. 361/111 |
| 6,147,369 A * | | 11/2000 | Chen et al. ...... 257/173 |
| 6,246,079 B1 * | | 6/2001 | Chen ............ 257/173 |
| 6,538,266 B1 * | | 3/2003 | Lee et al. ....... 257/173 |
| 2001/0007521 A1* | | 7/2001 | Chen ............ 361/56 |
| 2002/0079538 A1* | | 6/2002 | Su et al. ........ 257/355 |
| 2002/0089017 A1* | | 7/2002 | Lai et al. ....... 257/355 |
| 2004/0207020 A1* | | 10/2004 | Chen et al. ...... 257/355 |

FOREIGN PATENT DOCUMENTS

| | | |
|---|---|---|
| JP | 1-114068 A | 5/1989 |
| JP | 06-062529 | 3/1994 |
| JP | 09-045862 | 2/1997 |
| JP | 09-293881 | 11/1997 |
| JP | 2001-085534 | 3/2001 |
| JP | 2001-185738 | 7/2001 |
| JP | 2001-291836 | 10/2001 |

* cited by examiner

*Primary Examiner*—Kenneth Parker
*Assistant Examiner*—Paul Budd
(74) *Attorney, Agent, or Firm*—Arent Fox PLLC

(57) ABSTRACT

A semiconductor device has a p-type substrate, a low-concentration n-type region formed in the p-type substrate, a first high-concentration p-type region formed in the low-concentration n-type region and connected to a first electrode, a first high-concentration n-type region formed in the low-concentration n-type region and connected via a resistive element to the first electrode, a low-concentration p-type region formed contiguously with the first high-concentration n-type region, a second high-concentration n-type region and a second high-concentration p-type region formed in the p-type substrate and connected to a second electrode, and an element separator portion formed between the low-concentration p-type region and the second high-concentration n-type region. This makes it possible to control the switching characteristic of the electrostatic protection circuit with high accuracy and thus to cope with the thinning of the gate oxide film protected by the protection circuit.

13 Claims, 11 Drawing Sheets

F I G. 4 A
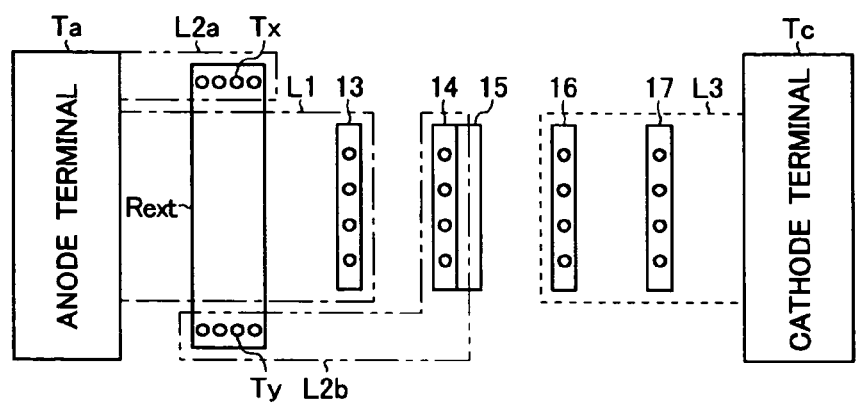
F I G. 4 B
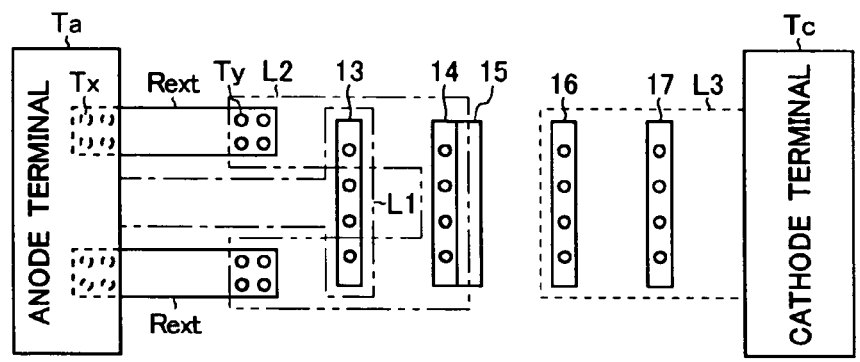

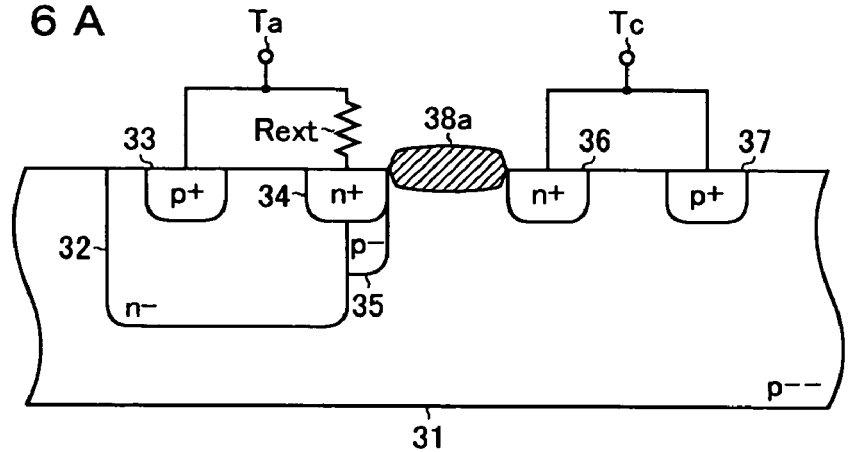
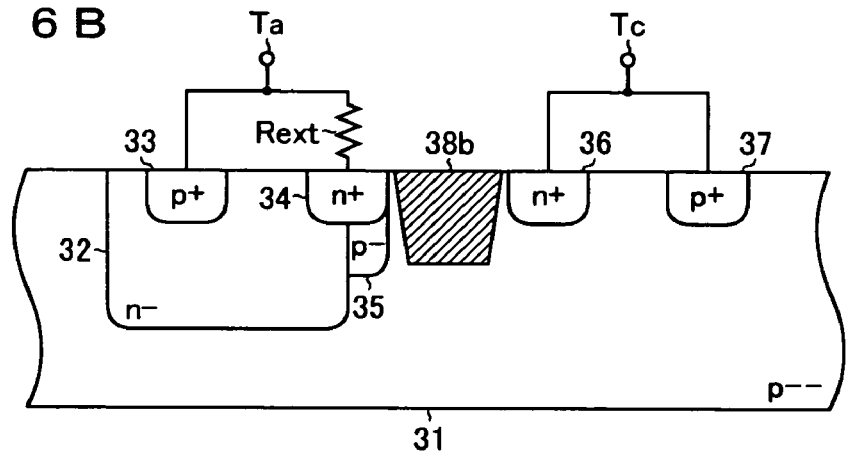
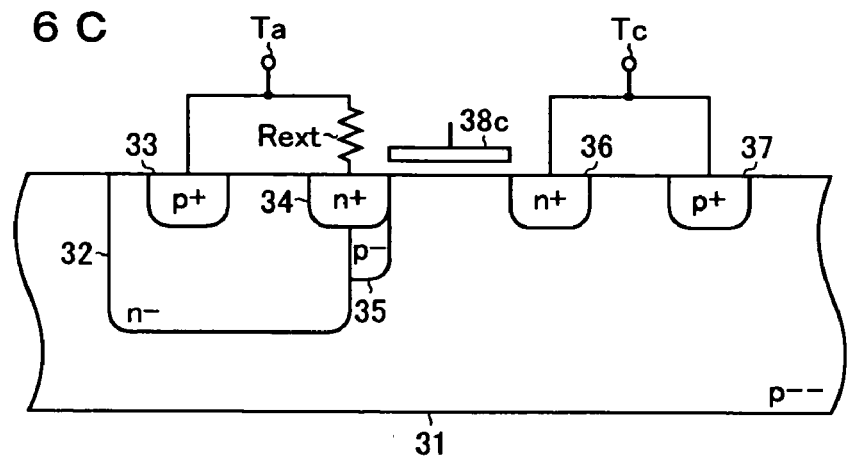

SEMICONDUCTOR DEVICE

This application is based on Japanese Patent Application No. 2003-069044 filed on Mar. 14, 2003, the contents of which are hereby incorporated by reference.

BACKGROUND OF THE INVENTION

1. Field of the Invention

The present invention relates to a semiconductor device (silicon-controlled rectifier, abbreviated to SCR) provided with a protection circuit against static electricity.

2. Description of the Prior Art

Generally speaking, semiconductor devices produced by the CMOS (complementary metal-oxide semiconductor) process have a thin gate oxide film and are thus poorly resistant to electrostatic discharge (hereinafter called "ESD"). For this reason, many semiconductor devices produced by the CMOS process are provided with, in an input/output portion thereof (for example, between an input/output terminal and a ground terminal and between a power terminal and a ground terminal), a protection circuit against static electricity. FIGS. 11A and 11B are vertical sectional views of the structures formed in conventional semiconductor devices so as to function as an electrostatic protection circuit.

The semiconductor device shown in FIG. 11A is composed of: a p-type [p−−] semiconductor substrate 71; a low-concentration n-type [n−] semiconductor region 72 formed in the p-type semiconductor substrate 71; a high-concentration n-type [n+] semiconductor region 73 and a high-concentration p-type [p+] semiconductor region 74 formed in the low-concentration n-type semiconductor region 72 and connected to an anode terminal Ta; a high-concentration n-type [n+] semiconductor region 75 formed so as to bridge between the p-type semiconductor substrate 71 and the n-type semiconductor region 72; a low-concentration n-type [n−] semiconductor region 76 formed in the p-type semiconductor substrate 71; a high-concentration n-type [n+] semiconductor region 77 formed above and contiguously with the low-concentration n-type semiconductor region 76 and connected to a cathode terminal Tc; and an insulator 78 for isolating the high-concentration n-type semiconductor region 75 from the high-concentration n-type semiconductor region 77 (see, for example, the specification of U.S. Pat. No. 5,502,317).

The semiconductor device shown in FIG. 11B is composed of: a p-type [p−−] semiconductor substrate 81; a low-concentration n-type [n−] semiconductor region 82 formed in the p-type semiconductor substrate 81; a high-concentration n-type [n+] semiconductor region 83 and a high-concentration p-type [p+] semiconductor region 84 formed in the low-concentration n-type semiconductor region 82 and connected to an anode terminal Ta; a high-concentration n-type [n+] semiconductor region 85 formed likewise in the low-concentration n-type semiconductor region 82; a high-concentration p-type [p+] semiconductor region 86 formed so as to bridge between the p-type semiconductor substrate 81 and the low-concentration n-type semiconductor region 82; a high-concentration n-type [n+] semiconductor region 87 and a high-concentration p-type [p+] semiconductor region 88 formed in the p-type semiconductor substrate 81 and connected to a cathode terminal Tc; a polysilicon portion 89a formed between the high-concentration n-type semiconductor region 85 and the high-concentration p-type semiconductor region 86; and an element separator region 89b for insulating the high-concentration p-type semiconductor region 86 from the high-concentration n-type semiconductor region 87 (see, for example, the publication of Japanese Patent Application Laid-Open No. 2001-185738, FIG. 13).

It is true that, in the semiconductor devices structured as described above, when an ESD surge voltage is applied to the anode terminal Ta, the trigger diode formed by the p-type semiconductor substrate 71 and the high-concentration n-type semiconductor region 75, or the trigger diode formed by the high-concentration p-type semiconductor region 86 and the high-concentration n-type semiconductor region 85, breaks down and causes a short circuit between the anode terminal Ta and the cathode terminal Tc. This protects the gate oxide film from electrostatic breakdown.

However, the semiconductor devices structured as described above are designed to protect a gate oxide film formed by the common 0.18 [µm] process, and accordingly, in those semiconductor devices, the arrangement of and the impurity concentrations in the p-type and n-type semiconductors that form the trigger diode are so adjusted that the trigger voltage of the electrostatic protection circuit is about 10 [V]. Thus, as increasingly fine semiconductor production processes (for example, the 0.13 and 0.1 [µm] processes) are introduced, the gate oxide film becomes increasingly thin (for example, with a film thickness of 30 [Å] or less), until, when the gate breakdown voltage Vgbd of the gate oxide film becomes lower (for example, 5 to 6 [V]) than the trigger voltage Vt, it is no longer possible to protect the gate oxide film before it breaks down electrostatically.

Moreover, in the semiconductor devices structured as described above, the trigger diode is connected to the anode terminal Ta not directly but by way of the low-concentration n-type semiconductor region 72 or 82 so that, by adjusting the resistance of the low-concentration n-type semiconductor region 72 or 82 inserted between the anode terminal Ta and the trigger diode, the switching characteristic of the electrostatic protection circuit can be controlled. It is, however, difficult to control the resistance, and this makes it difficult to enhance the switching characteristic on which increasingly strict requirements are imposed as increasingly fine semiconductor production processes are used.

SUMMARY OF THE INVENTION

An object of the present invention is to provide a semiconductor device that permits highly accurate control of the switching characteristic of an electrostatic protection circuit and that permits the thinning of the gate oxide film protected by the electrostatic protection circuit.

To achieve the above object, according to one aspect of the present invention, a semiconductor device is provided with a p-type semiconductor substrate, a low-concentration n-type semiconductor region formed in the p-type semiconductor substrate, a first high-concentration p-type semiconductor region formed in the low-concentration n-type semiconductor region and connected to a first electrode, a first high-concentration n-type semiconductor region formed likewise in the low-concentration n-type semiconductor region and connected via a resistive element to the first electrode, a low-concentration p-type semiconductor region formed contiguously with the first high-concentration n-type semiconductor region, a second high-concentration n-type semiconductor region and a second high-concentration p-type semiconductor region formed in the p-type semiconductor substrate and connected to a second electrode, and an element separator portion formed between the low-concentration p-type semiconductor region and the second high-concentration n-type semiconductor region.

According to another aspect of the present invention, a semiconductor device produced under the rules of a 0.18-μm or below process is provided with, as a protection circuit for protecting a terminal of the semiconductor device, a thyristor circuit that conducts at an input voltage lower than the gate breakdown voltage.

BRIEF DESCRIPTION OF THE DRAWINGS

This and other objects and features of the present invention will become clear from the following description, taken in conjunction with the preferred embodiments with reference to the accompanying drawings in which:

FIGS. 4A and 4B are top views showing examples of the arrangement layout of the external resistor Rext;

FIGS. 6A to 6C are vertical sectional views showing examples of the semiconductor device of a third embodiment of the invention;

DESCRIPTION OF THE PREFERRED EMBODIMENTS

Figure 1A:
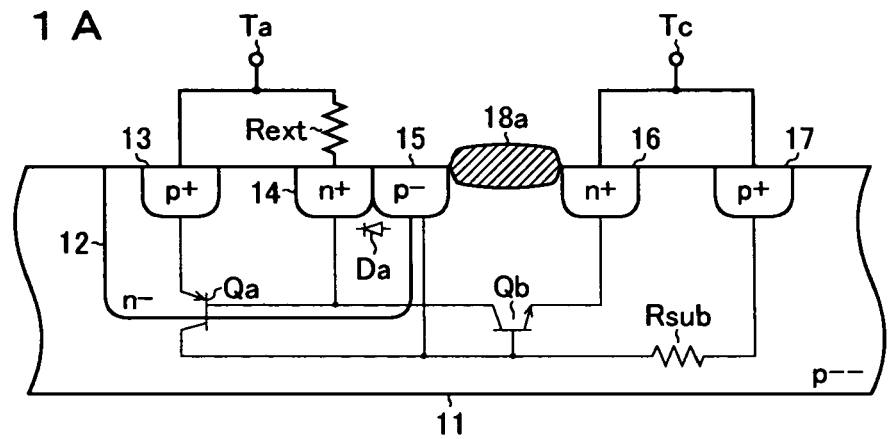
FIGS. 1A to 1C are vertical sectional views showing examples of the semiconductor device of a first embodiment of the invention.
Figure 1B:
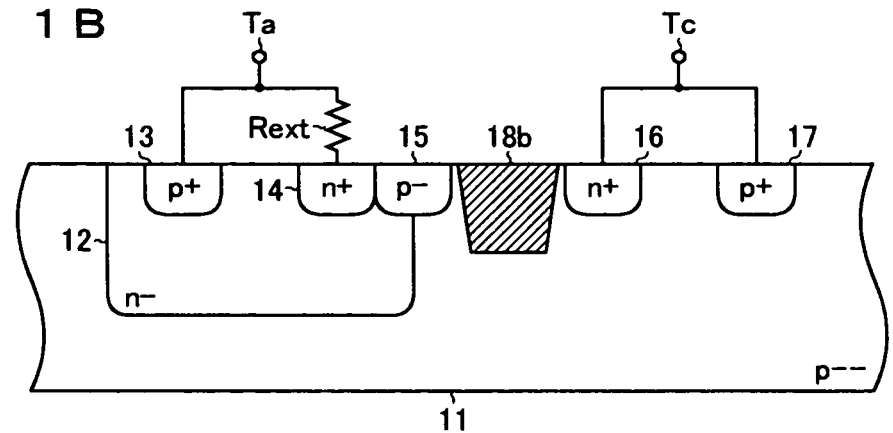
Figure 1C:
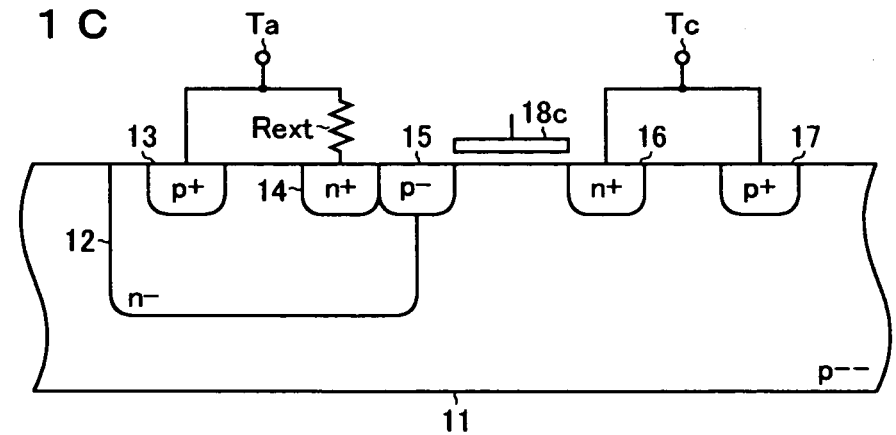

First, the semiconductor device of a first embodiment of the invention will be described. FIGS. 1A to 1C are vertical sectional views showing the semiconductor device of the first embodiment of the invention. As shown in these figures, the semiconductor device of this embodiment is composed of: a p-type [p−−] semiconductor substrate 11 (hereinafter called the "p substrate 11"); a low-concentration n-type [n−] semiconductor region 12 (hereinafter called the "n well 12") formed in the p substrate 11; a first high-concentration p-type [p+] semiconductor region 13 (hereinafter called the "p+ region 13") formed in the n well 12 and connected to an anode terminal Ta; a first high-concentration n-type [n+] semiconductor region 14 (hereinafter called the "n+ region 14") formed likewise in the n well 12 and connected by way of an external resistor Rext to the anode terminal Ta; a low-concentration p-type [p−] semiconductor region 15 (hereinafter called the "p− region 15") formed contiguously with the n+ region 14 in such a way as to bridge between the p substrate 11 and the n well 12; a second high-concentration n-type [n+] semiconductor region 16 and a second high-concentration p-type [p+] semiconductor region 17 (hereinafter called the "n+ region 16" and the "p+ region 17," respectively) formed in the p substrate 11 and connected to a cathode terminal Tc; and an element separator portion 18a, 18b, or 18c for separating between the p− region 15 and the n+ region 16 (i.e., between the anode and the cathode). In this embodiment, the element separator portion 18a, 18b, or 18c is formed as a LOCOS portion 18a, trench portion 18b, or gate portion 18c, respectively.

In the semiconductor device structured as described above, the p substrate 11, the n well 12, and the p+ region 13 together form a pnp-type bipolar transistor Qa, and the n well 12, the p substrate 11, and the n+ region 16 together form an npn-type bipolar transistor Qb. Moreover, in the semiconductor device structured as described above, the n+ region 14 and the p− region 15 together form a trigger diode Da. Here, the base width of the transistor Qb is controlled by controlling the element width of the element separator portion 18a, 18b, or 18c.

Figure 2:
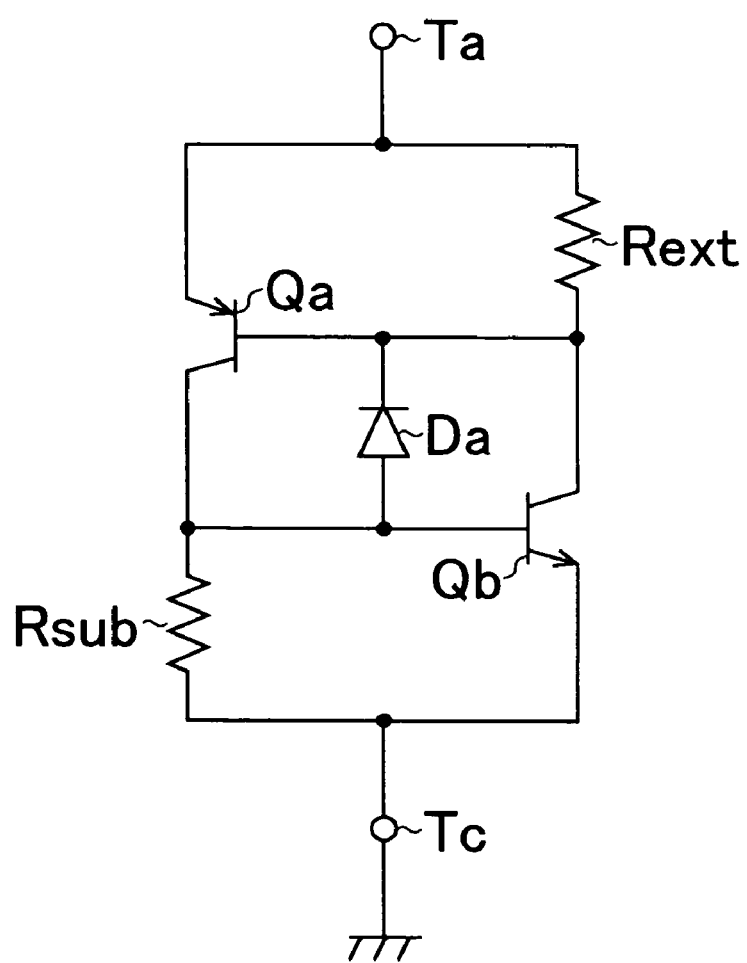
FIG. 2 is an equivalent circuit diagram of the semiconductor device of the first embodiment.

FIG. 2 is an equivalent circuit diagram of the semiconductor device of this embodiment. As shown in this figure, the emitter of the transistor Qa is connected to the anode terminal Ta. The collector of the transistor Qa is, on one hand, connected by way of a substrate resistor Rsub to the cathode terminal Tc and, on the other hand, also connected to the anode of the trigger diode Da and to the base of the transistor Qb. The base of the transistor Qa is, on one hand, connected by way of the external resistor Rext to the anode terminal Ta and, on the other hand, also connected to the cathode of the trigger diode Da and to the collector of the transistor Qb. The emitter of the transistor Qb is connected to the cathode terminal Tc.

In the semiconductor device structured as described above, when a positive ESD surge voltage is applied to the anode terminal Ta, the trigger diode Da is reversely biased by way of the external resistor Rext, and, if this reverse bias is higher than the breakdown voltage of the trigger diode Da, a breakdown current flows through the trigger diode Da from its anode to cathode. When this breakdown current flows to the cathode terminal Tc, which is grounded, the substrate resistor Rsub raises the base potential of the transistor Qb, and this turns the transistor Qb on. When a collector current flows through the transistor Qb, the external resistor Rext lowers the base potential of the transistor Qa, and this turns the transistor Qa on. The collector current of the transistor Qa is equal to the base current of the transistor Qb, and thus the whole operation described above is now under positive feedback control. In this way, the operation for achieving electrostatic protection (i.e., the operation for keeping a short-circuited path between the anode terminal Ta and the cathode terminal Tc) is maintained.

Figure 3:
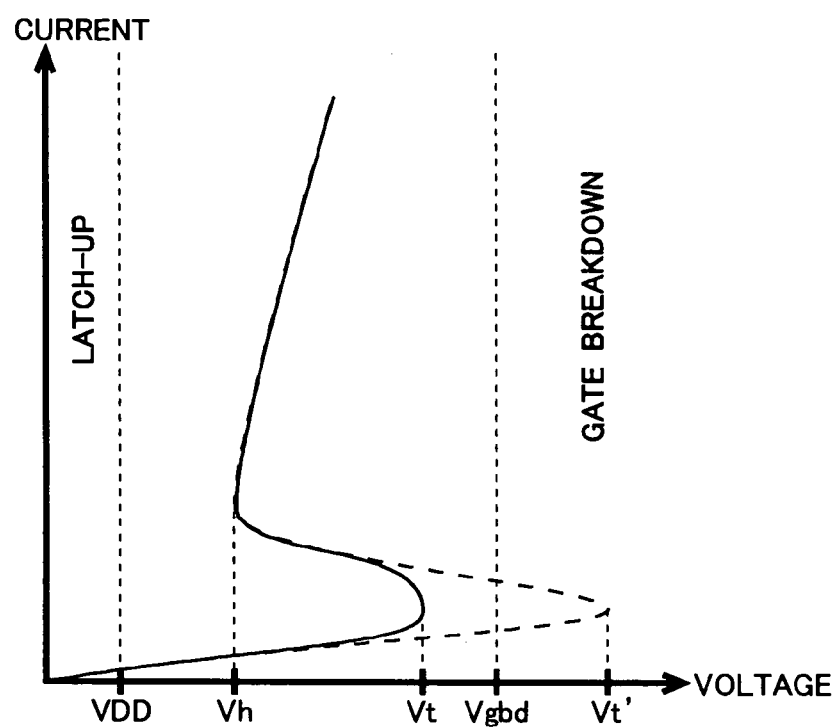
FIG. 3 is a diagram showing the TLP curve that represents the switching characteristic of the electrostatic protection circuit used in the semiconductor device of the first embodiment.

FIG. 3 is a diagram showing the TLP (transmission line pulse) curve that represents the switching characteristic of the electrostatic protection circuit used in the semiconductor device of this embodiment. Here, the TLP curve observed in this embodiment is indicated by a solid line, and, for comparison, the TLP curve observed in the conventional structures is indicated by a broken line. In this figure, along the horizontal axis is taken the voltage, and along the vertical axis is taken the current. Moreover, along the horizontal axis are shown the following parameters: the supply voltage VDD; the hold voltage Vh (i.e., the voltage needed to maintain the electrostatic protection operation);

the gate breakdown voltage Vgbd (i.e., the voltage at which the CMOS gate oxide film to be protected breaks down); and the trigger voltages Vt and Vt' (the voltage at which the operation for electrostatic protection is started).

Figure 11A:
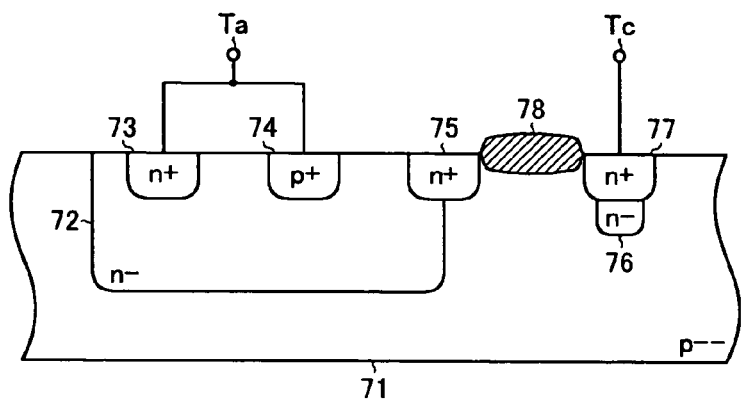
FIGS. 11A and 11B are vertical sectional views of the structures formed in conventional semiconductor devices so as to function as an electrostatic protection circuit.
Figure 11B:
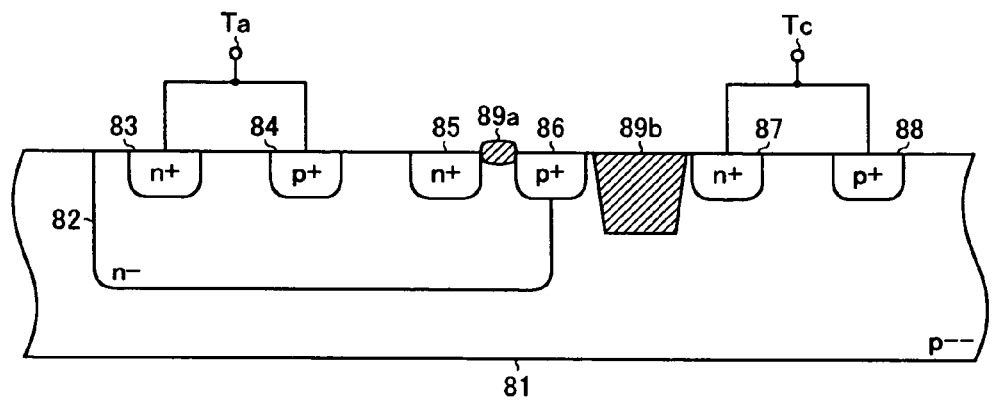

As described above, in the semiconductor device of this embodiment, the p−/n+ junction surface of the trigger diode Da is formed, not by the combination of a p substrate and an n+ region (see FIG. 11A) or by the combination of a p+ region and an n+ region formed at a predetermined interval from each other (see FIG. 11B) as conventionally adopted, but by the n+ region 14 and the p− region 15 that are formed contiguously with each other. In this structure, simply by adjusting the impurity concentration in the p− region 15, it is possible to set the trigger voltage Vt lower than the conventional trigger voltage Vt' and simultaneously lower than the gate breakdown voltage Vgbd. Accordingly, even as increasingly fine semiconductor production processes are used and as a result the gate oxide film becomes increasingly thin and the gate breakdown voltage thereof becomes increasingly low, it is possible to set the trigger voltage Vt lower than that voltage surely and easily. This makes it possible to protect the gate oxide film before it breaks down electrostatically.

Incidentally, simply forming the p+ and n+ regions of the trigger diode, which are conventionally formed at a predetermined distance from each other, contiguously with each other results in making the trigger voltage Vt so low as to be lower than the supply voltage VDD, and this causes latch-up. To avoid this, triggering needs to be performed appropriately between the supply voltage VDD and the gate breakdown voltage Vgbd (for example, between 4 and 8 [V]), and, to achieve this, as in this embodiment, the p− region 15, which is formed by the low-doped drain method or the like (and in which the impurity concentration is about $10^{18}$ [cm$^{-3}$]), needs to be formed contiguously with the n+ region 14.

In the semiconductor device of this embodiment, instead of the conventional structure, in which an n-well resistive component is inserted between the anode terminal and the trigger diode and the resistive component is adjusted to control the switching characteristic of the electrostatic protection circuit, a structure is adopted in which the cathode of the trigger diode Da is connected by way of the external resistor Rext directly to the anode terminal Ta. This structure, in which the base resistor that is important for controlling the switching of the transistor Qa is provided as an external resistor Rext, permits the resistance thereof to be controlled easily, and thus makes it possible to surely give the base resistor of the transistor Qa the desired resistance. Accordingly, even as increasingly fine semiconductor production processes are used, it is easy to set the trigger voltage Vt and the hold voltage Vh, which determine the device characteristic. Thus, it is possible to enhance the switching characteristic, secure the optimum margins, and increase the yield rate.

Moreover, the semiconductor device of this embodiment can be produced by the common CMOS process and thus without any undue increase in the costs. Moreover, the semiconductor device of this embodiment, owing to its SCR structure, occupies a smaller area than do conventional protection devices of the ggnMOS (grounded-gate NMOS) type.

Next, the arrangement layout of the external resistor Rext will be described. FIGS. 4A and 4B are top views showing examples of the arrangement layout of the external resistor Rext. These figures both deal with cases in which the elements are arranged in the following order from left to right of the figures: the anode terminal Ta, the external resistor Rext, the p+ region 13, the n+ region 14, the p− region 15, the n+ region 16, the p+ region 17, and the cathode terminal Tc. The terminals Ta and Tc may be formed as electrodes (pads).

In the semiconductor device shown in FIG. 4A, the external resistor Rext is arranged between the anode terminal Ta and the n+ region 14 perpendicularly to the direction that connects these two elements. Moreover, the external resistor Rext has, at one end thereof, a first contact Tx that is electrically connected by way of a conductor L2a to the anode terminal Ta, and has, at the other end thereof, a second contact Ty that is electrically connected by way of a conductor L2b to the n+ region 14. On the other hand, in the semiconductor device shown in FIG. 4B, the external resistor Rext is arranged between the anode terminal Ta and the n+ region 14 parallel to the direction that connects these two elements. Moreover, the external resistor Rext has, at one end thereof, a first contact Tx that is electrically connected to the anode terminal Ta, and has, at the other end thereof, a second contact Ty that is electrically connected by way of a conductor L2 to the n+ region 14. In both of these arrangement layouts, the p+ region 13 is connected by way of a conductor L1 to the anode terminal Ta, and the n+ region 16 and the p+ region 17 are connected by way of a conductor L3 to the cathode terminal Tc.

By adopting these arrangement layouts, it is possible to increase the area efficiency of the semiconductor device and thereby reduce the chip scale thereof. These arrangement layouts can be realized by a two-layer metal process, but, from the perspective of the area efficiency of the layouts, it is preferable to adopt a three-layer metal process. The external resistor Rext is realized by forming an n-well resistor or polysilicon resistor so as to have a resistance of several [kΩ].

Figure 5A:
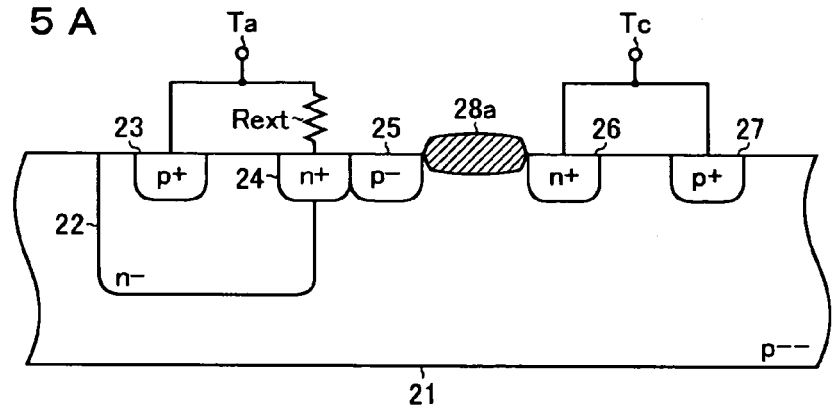
FIGS. 5A to 5C are vertical sectional views showing examples of the semiconductor device of a second embodiment of the invention.
Figure 5B:
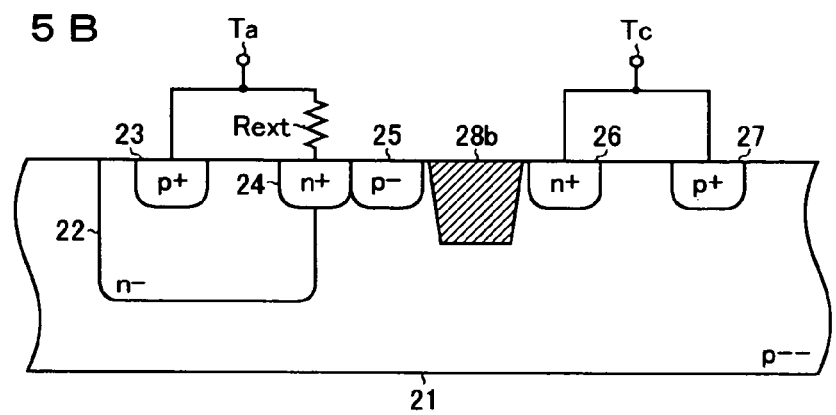
Figure 5C:
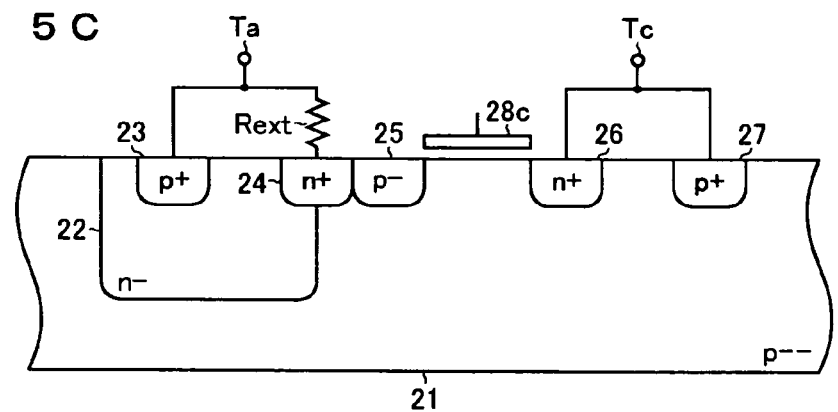

Next, the semiconductor device of a second embodiment of the invention will be described. FIGS. 5A to 5C are vertical sectional views showing the semiconductor device of the second embodiment of the invention. As shown in these figures, the semiconductor device of this embodiment is composed of: a p substrate 21; an n well. 22 formed in the p substrate 21; a p+ region 23 formed in the n well 22 and connected to an anode terminal Ta; an n+ region 24 formed so as to bridge between the p substrate 21 and the n well 22 and connected by way of an external resistor Rext to the anode terminal Ta; a p− region 25 formed in the p substrate 21 by the side of and contiguously with the n+ region 24; an n+ region 26 and a p+ region 27 formed in the p substrate 21 and connected to a cathode terminal Tc; and an element separator portion 28a, 28b, or 28c for separating between the p− region 25 and the n+ region 26. The equivalent circuit of the semiconductor device of this embodiment is the same as the one described earlier in connection with the first embodiment (see FIG. 2). Structured as described above, the semiconductor device can be produced, as in the first embodiment, by the common CMOS process. Thus, it is possible to obtain the same advantages as described earlier without any undue increase in the costs.

Next, the semiconductor device of a third embodiment of the invention will be described. FIGS. 6A to 6C are vertical sectional views showing the semiconductor device of the third embodiment of the invention. As shown in these figures, the semiconductor device of this embodiment is composed of: a p substrate 31; an n well 32 formed in the p substrate 31; a p+ region 33 formed in the n well 32 and connected to an anode terminal Ta; an n+ region 34 formed so as to bridge between the p substrate 31 and the n well 32 and connected by way of an external resistor Rext to the anode terminal Ta; a p− region 35 formed in the p substrate 31 below and contiguously with the n+ region 34; an n+ region 36 and a p+ region 37 formed in the p substrate 31 and connected to a cathode terminal Tc; and an element separator portion 38a, 38b, or 38c for separating between the p− region 35 and the n+ region 36. The equivalent circuit of the semiconductor device of this embodiment is the same as the one described earlier in connection with the first embodiment (see FIG. 2). By forming the p− region 35 deep in the p substrate 31 and forming the p− region 35 not by the side of but below the n+ region 34 in this way, it is possible to obtain the advantages as described earlier and in addition reduce the chip scale in the lateral direction as compared with in the first and second embodiments described above.

Figure 7A:
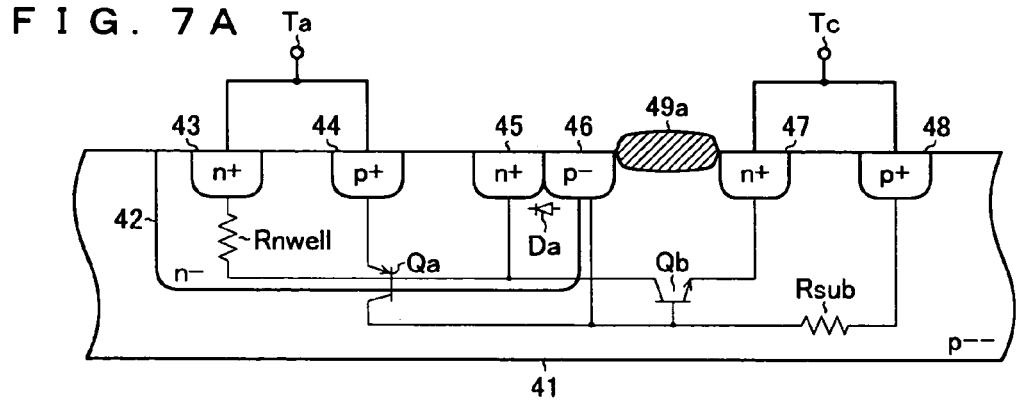
FIGS. 7A to 7C are vertical sectional views showing examples of the semiconductor device of a fourth embodiment of the invention.
Figure 7B:
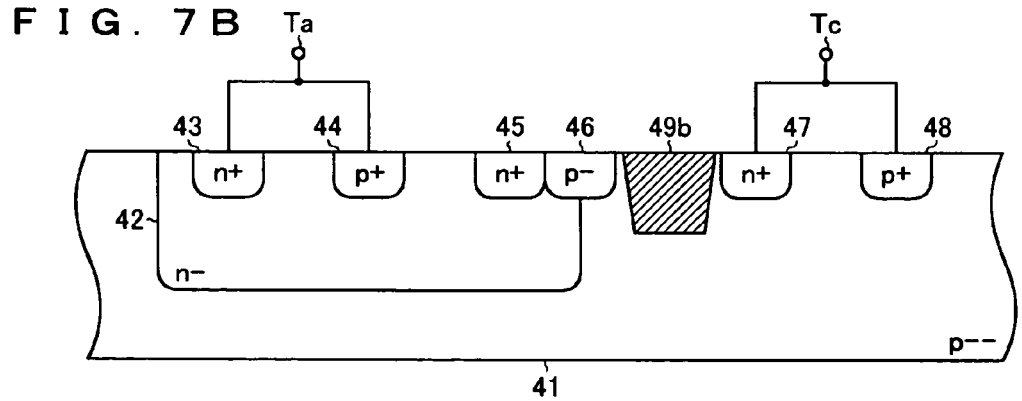
Figure 7C:
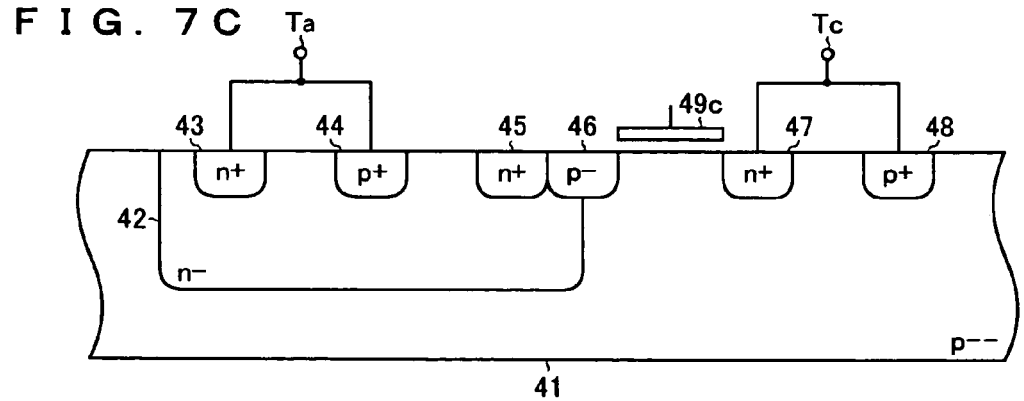

Next, the semiconductor device of a fourth embodiment of the invention will be described. FIGS. 7A to 7C are vertical sectional views showing the semiconductor device of the fourth embodiment of the invention. As shown in these figures, the semiconductor device of this embodiment is composed of: a p-type [p−−] semiconductor substrate 41 (hereinafter called the "p substrate 41"); a low-concentration n-type [n−] semiconductor region 42 (hereinafter called the "n well 42") formed in the p substrate 41; a first high-concentration n-type [n+] semiconductor region 43 and a first high-concentration p-type [p+] semiconductor region 44 (hereinafter called the "n+ region 43" and the "p+ region 44," respectively) formed in the n well 42 and connected to an anode terminal Ta; a second high-concentration n-type [n+] semiconductor region 45 (hereinafter called the "n+ region 45") formed likewise in the n well 42; a low-concentration p-type [p−] semiconductor region 46 (hereinafter called the "p− region 46") formed contiguously with the n+ region 45 so as to bridge between the p substrate 41 and the n well 42; a third high-concentration n-type [n+] semiconductor region 47 and a second high-concentration p-type [p+] semiconductor region 48 (hereinafter called the "n+ region 47" and the "p+ region 48," respectively) formed in the p substrate 41 and connected to a cathode terminal Tc; and an element separator portion 49a, 49b, or 49c for separating between the p− region 46 and the n+ region 47 (i.e., between the anode and the cathode). In this embodiment, the element separator portion 49a, 49b, or 49c is formed as a LOCOS portion 49a, trench portion 49b, or gate portion 49c, respectively.

In the semiconductor device structured as described above, the p substrate 41, the n well 42, and the p+ region 44 together form a pnp-type bipolar transistor Qa, and the n well 42, the p substrate 41, and the n+ region 47 together form an npn-type bipolar transistor Qb. Moreover, in the semiconductor device structured as described above, the n+ region 45 and the p− region 46 together form a trigger diode Da. Here, the base width of the transistor Qb is controlled by controlling the element width of the element separator portion 49a, 49b, or 49c.

Figure 8:
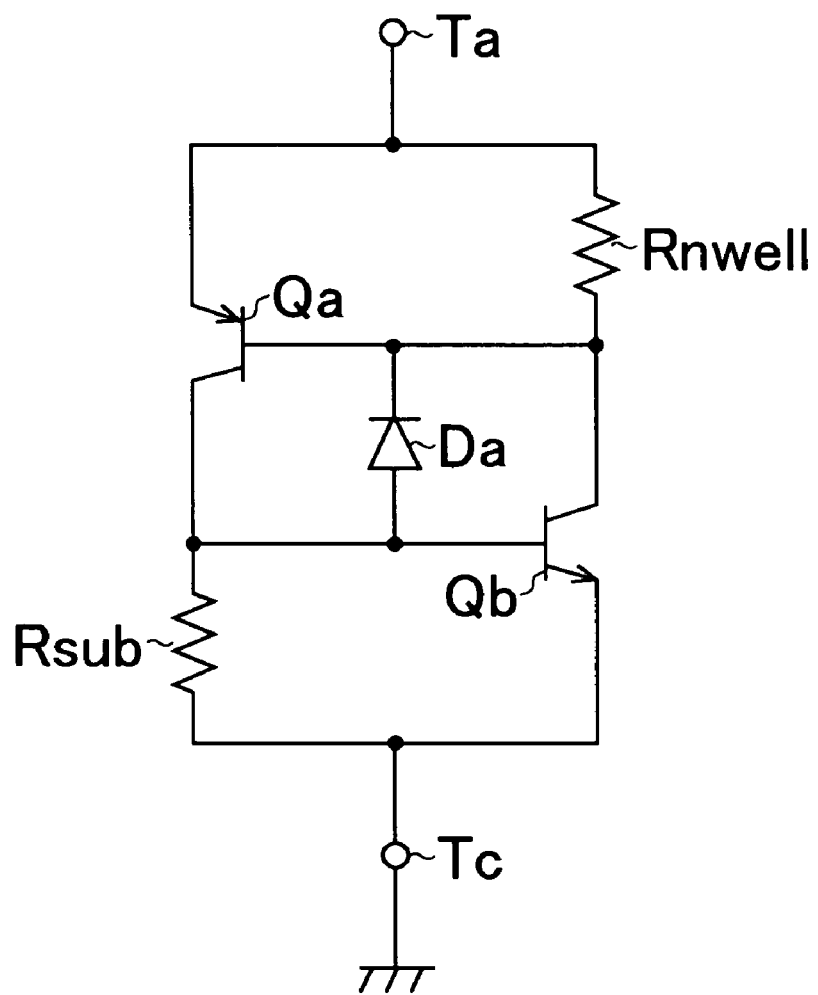
FIG. 8 is an equivalent circuit diagram of the semiconductor device of the fourth embodiment.

FIG. 8 is an equivalent circuit diagram of the semiconductor device of this embodiment. As shown in this figure, the emitter of the transistor Qa is connected to the anode terminal Ta. The collector of the transistor Qa is, on one hand, connected by way of a substrate resistor Rsub to the cathode terminal Tc and, on the other band, also connected to the anode of the trigger diode Da and to the base of the transistor Qb. The base of the transistor Qa is, on one hand, connected by way of an n-well resistor Rnwell to the anode terminal Ta and, on the other hand, also connected to the cathode of the trigger diode Da and to the collector of the transistor Qb. The emitter of the transistor Qb is connected to the cathode terminal Tc.

In the semiconductor device structured as described above, when a positive ESD surge voltage is applied to the anode terminal Ta, the trigger diode Da is reversely biased by way of the n-well resistor Rnwell, and, if this reverse bias is higher than the breakdown voltage of the trigger diode Da, a breakdown current flows through the trigger diode Da from its anode to cathode. When this breakdown current flows to the cathode terminal Tc, which is grounded, the substrate resistor Rsub raises the base potential of the transistor Qb, and this turns the transistor Qb on. When a collector current flows through the transistor Qb, the n-well resistor Rnwell lowers the base potential of the transistor Qa, and this turns the transistor Qa on. The collector current of the transistor Qa is equal to the base current of the transistor Qb, and thus the whole operation described above is now under positive feedback control. In this way, the operation for achieving electrostatic protection (i.e., the operation for keeping a short-circuited path between the anode terminal Ta and the cathode terminal Tc) is maintained.

As described above, in the semiconductor device of this embodiment, the p−/n+ junction surface of the trigger diode Da is formed, not by the combination of a p substrate and an n+ region (see FIG. 11A) or by the combination of a p+ region and an n+ region formed at a predetermined interval from each other (see FIG. 11B) as conventionally adopted, but by the n+ region 45 and the p− region 46 that are formed contiguously with each other. In this structure, simply by adjusting the impurity concentration in the p− region 46, it is possible to set the trigger voltage Vt lower than the conventional trigger voltage Vt' and simultaneously lower than the gate breakdown voltage Vgbd. Accordingly, even as increasingly fine semiconductor production processes are used and as a result the gate oxide film becomes increasingly thin and the gate breakdown voltage thereof becomes increasingly low, it is possible to set the trigger voltage Vt lower than that voltage surely and easily. This makes it possible to protect the gate oxide film before it breaks down electrostatically.

Incidentally, simply forming the p+ and n+ regions of the trigger diode, which are conventionally formed at a predetermined distance from each other, contiguously with each other results in making the trigger voltage Vt so low as to be lower than the supply voltage VDD, and this causes latch-up. To avoid this, triggering needs to be performed appropriately between the supply voltage VDD and the gate breakdown voltage Vgbd (for example, between 4 and 8 [V]), and, to achieve this, as in this embodiment, the p− region 46, which is formed by the low-doped drain method or the like (and in which the impurity concentration is about $10^{18}$ [cm$^{-3}$]), needs to be formed contiguously with the n+ region 45.

In the semiconductor device of this embodiment, between the anode terminal Ta and the trigger diode Da is inserted the n-well resistor Rnwell of which the resistance is adjusted to control the switching characteristic of the electrostatic protection circuit. Thus, as compared with in the first to third embodiments, it is here more difficult to control the base resistance of the transistor Qa. In exchange, however, there is no need to provide the base resistor outside the p substrate 41. This helps to simplify the production process and to reduce the costs.

Moreover, the semiconductor device of this embodiment can be produced by the common CMOS process and thus without any undue increase in the costs. Moreover, the semiconductor device of this embodiment, owing to its SCR structure, occupies a smaller area than do conventional protection devices of the ggnMOS (grounded-gate nMOS) type.

Figure 9A:
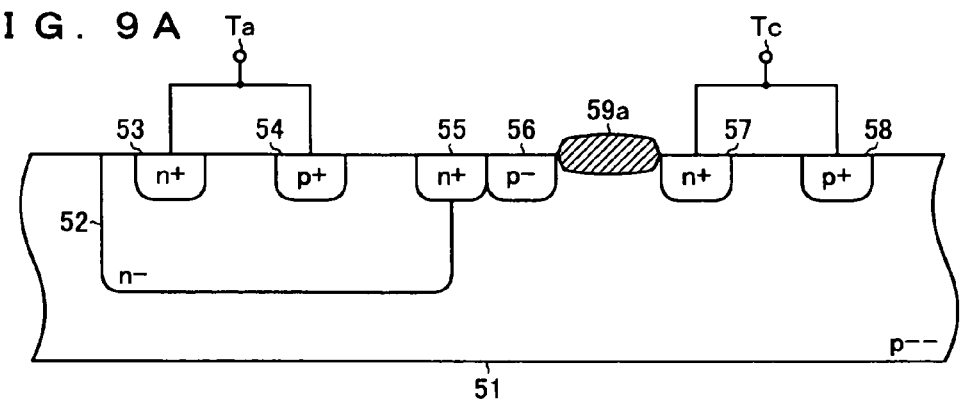
FIGS. 9A to 9C are vertical sectional views showing examples of the semiconductor device of a fifth embodiment of the invention.
Figure 9B:
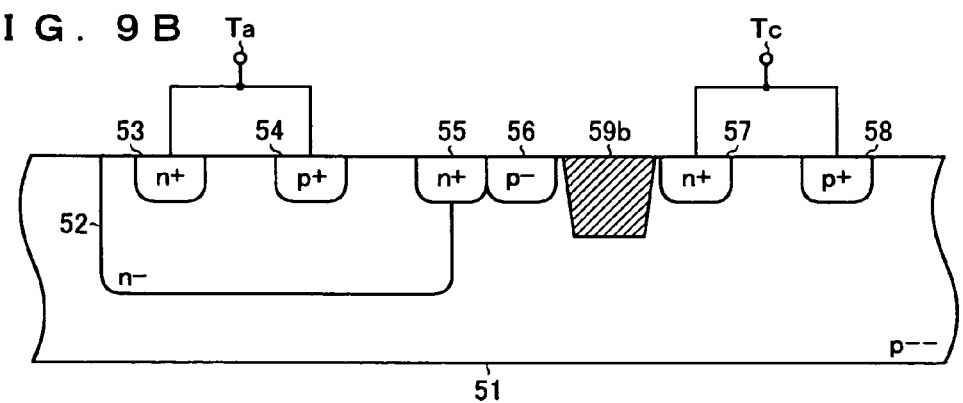
Figure 9C:
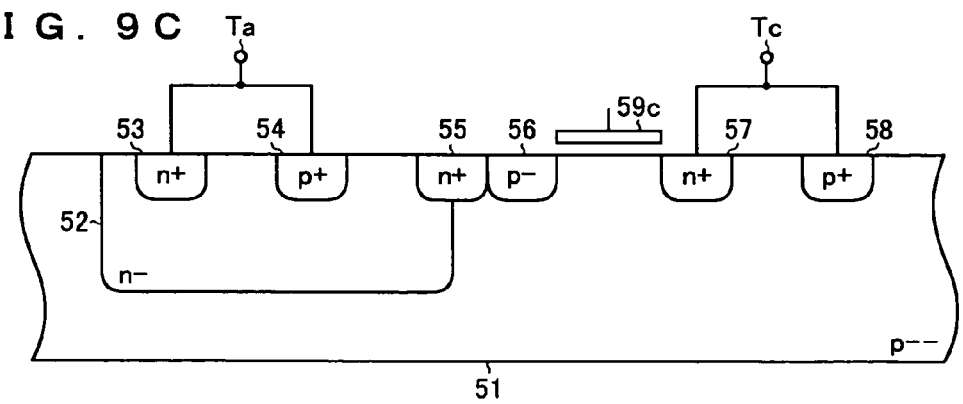

Next, the semiconductor device of a fifth embodiment of the invention will be described. FIGS. 9A to 9C are vertical sectional views showing the semiconductor device of the fifth embodiment of the invention. As shown in these figures, the semiconductor device of this embodiment is composed of: a p substrate 51; an n well 52 formed in the p substrate 51; an n+ region 53 and a p+ region 54 formed in the n well 52 and connected to an anode terminal Ta; an n+ region 55 formed so as to bridge between the p substrate 51 and the n well 52; a p– region 56 formed in the p substrate 51 by the side of and contiguously with the n+ region 55; an n+ region 57 and a p+ region 58 formed in the p substrate 51 and connected to a cathode terminal Tc; and an element separator portion 59a, 59b, or 59c for separating between the p– region 56 and the n+ region 57. The equivalent circuit of the semiconductor device of this embodiment is the same as the one described earlier in connection with the fourth embodiment (see FIG. 8). Structured as described above, the semiconductor device can be produced, as in the first embodiment, by the common CMOS process. Thus, it is possible to obtain the same advantages as described earlier without any undue increase in the costs.

Figure 10A:
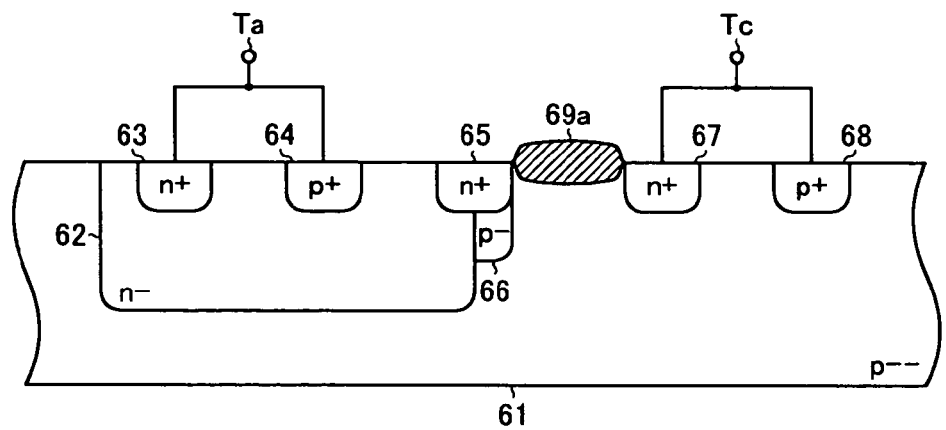
FIGS. 10A to 10C are vertical sectional views showing examples of the semiconductor device of a sixth embodiment of the invention.
Figure 10B:
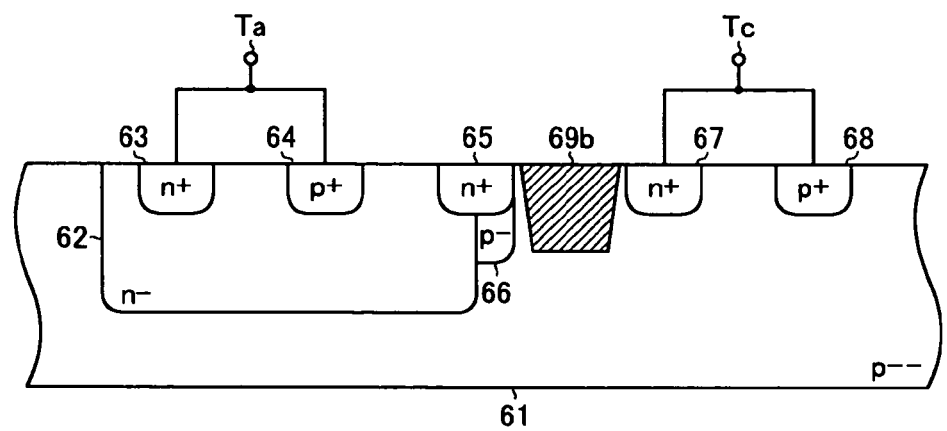
Figure 10C:
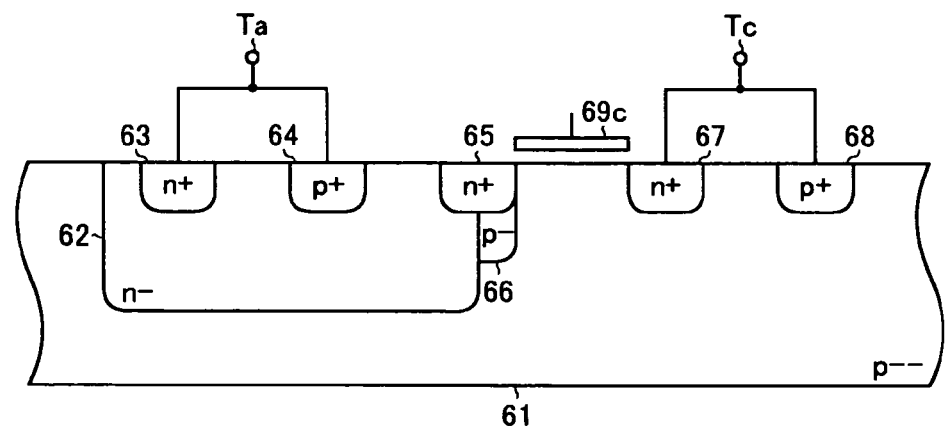

Next, the semiconductor device of a sixth embodiment of the invention will be described. FIGS. 10A to 10C are vertical sectional views showing the semiconductor device of the sixth embodiment of the invention. As shown in these figures, the semiconductor device of this embodiment is composed of: a p substrate 61; an n well 62 formed in the p substrate 61; an n+ region 63 and a p+ region 64 formed in the n well 62 and connected to an anode terminal Ta; an n+ region 65 formed so as to bridge between the p substrate 61 and the n well 62; a p– region 66 formed in the p substrate 61 below and contiguously with the n+ region 65; an n+ region 67 and a p+ region 68 formed in the p substrate 61 and connected to a cathode terminal Tc; and an element separator portion 69a, 69b, or 69c for separating between the p– region 66 and the n+ region 67. The equivalent circuit of the semiconductor device of this embodiment is the same as the one described earlier in connection with the fourth embodiment (see FIG. 8). By forming the p– region 66 deep in the p substrate 61 and forming the p– region 66 not by the side of but below the n+ region 65 in this way, it is possible to obtain the advantages as described earlier and in addition reduce the chip scale in the lateral direction as compared with in the fourth and fifth embodiments described above.

As described above, according to one aspect of the present invention, a semiconductor device is provided with a p-type semiconductor substrate, a low-concentration n-type semiconductor region formed in the p-type semiconductor substrate, a first high-concentration p-type semiconductor region formed in the low-concentration n-type semiconductor region and connected to a first electrode, a first high-concentration n-type semiconductor region formed likewise in the low-concentration n-type semiconductor region and connected via a resistive element to the first electrode, a low-concentration p-type semiconductor region formed contiguously with the first high-concentration n-type semiconductor region, a second high-concentration n-type semiconductor region and a second high-concentration p-type semiconductor region formed in the p-type semiconductor substrate and connected to a second electrode, and an element separator portion formed between the low-concentration p-type semiconductor region and the second high-concentration n-type semiconductor region.

In the semiconductor device structured as described above, advisably, the low-concentration p-type semiconductor region is formed so as to bridge between the p-type semiconductor substrate and the low-concentration n-type semiconductor region, and the resistive element is formed outside the p-type semiconductor substrate. Alternatively, in the semiconductor device structured as described above, advisably, the first high-concentration n-type semiconductor region is formed so as to bridge between the p-type semiconductor substrate and the low-concentration n-type semiconductor region, and the resistive element is formed outside the p-type semiconductor substrate.

With these structures, it is possible to control the switching characteristic of the electrostatic protection circuit with high accuracy and thus to cope with the thinning of the gate oxide film to be protected.

In the semiconductor device structured as described above, advisably, the low-concentration p-type semiconductor region is formed by the side of and contiguous with the first high-concentration n-type semiconductor region. Structured in this way, the semiconductor device can be produced by the common CMOS process and thus without any undue increase in the costs.

Alternatively, in the semiconductor device structured as described above, advisably, the low-concentration p-type semiconductor region is formed below and contiguous with the first high-concentration n-type semiconductor region. With this structure, it is possible to obtain the same advantages as described above and in addition reduce the chip scale in the lateral direction as compared with the structure described just above.

In the semiconductor device structured as described above, advisably, the resistive element is formed between the first electrode and the first high-concentration n-type semiconductor region in such a way as to lie perpendicular or parallel to the direction that connects those two elements. The resistive element has at one end thereof a first contact that is electrically connected to the first electrode and having at the other end thereof a second contact that is electrically connected to the first high-concentration n-type semiconductor region. With this arrangement layout, it is possible to increase the area efficiency of the semiconductor device and thereby reduce the chip scale thereof.

In the semiconductor device structured as described above, advisably, the low-concentration p-type semiconductor region is formed so as to bridge between the p-type semiconductor substrate and the low-concentration n-type semiconductor region, and the resistive element is formed inside the low-concentration n-type semiconductor region. Alternatively, advisably, the first high-concentration n-type semiconductor region is formed so as to bridge between the p-type semiconductor substrate and the low-concentration n-type semiconductor region, and the resistive element is formed inside the low-concentration n-type semiconductor region. With these structures, it is possible to cope with the thinning of the gate oxide film to be protected.

In the semiconductor device structured as described above, advisably, the low-concentration p-type semiconductor region is formed by the side of and contiguous with the first high-concentration n-type semiconductor region. Structured in this way, the semiconductor device can be produced by the common CMOS process and thus without any undue increase in the costs.

Alternatively, in the semiconductor device structured as described above, advisably, the low-concentration p-type semiconductor region is formed below and contiguous with the first high-concentration n-type semiconductor region. With this structure, it is possible to obtain the same advantages as described above and in addition reduce the chip scale in the lateral direction as compared with the structure described just above.

According to another aspect of the present invention, a semiconductor device produced under the rules of a 0.18-μm or below process is provided with, as a protection circuit for protecting a terminal of the semiconductor device, a thyristor circuit that conducts at an input voltage lower than the gate breakdown voltage. In the semiconductor device structured in this way, advisably, the thyristor circuit has, between the bases of the transistors of which the thyristor circuit is composed, a trigger diode of which the cathode is connected to the anode of the thyristor circuit and of which the anode is connected to the cathode of the thyristor circuit. In the semiconductor device structured in this way, advisably, a resistive element is formed between the cathode of the trigger diode and the anode of the thyristor circuit. With these structures, simply by adjusting the impurity concentration in the trigger diode, it is possible to control the trigger voltage of the thyristor circuit easily and thus to cope with the thinning of the gate oxide film to be protected.

What is claimed is:

1. A semiconductor device comprising:
   a p-type semiconductor substrate;
   a low-concentration n-type semiconductor region formed in the p-type semiconductor substrate;
   a first electrode;
   a first high-concentration p-type semiconductor region formed in the low-concentration n-type semiconductor region and connected to the first electrode;
   a resistive element;
   a first high-concentration n-type semiconductor region formed in the low-concentration n-type semiconductor region and connected by way of the resistive element to the first electrode;
   a low-concentration p-type semiconductor region formed contiguously with the first high-concentration n-type semiconductor region;
   a second electrode;
   a second high-concentration n-type semiconductor region formed in the p-type semiconductor substrate and connected to the second electrode;
   a second high-concentration p-type semiconductor region formed in the p-type semiconductor substrate and connected to the second electrode; and
   an element separator portion formed between the low-concentration p-type semiconductor region and the second high-concentration n-type semiconductor region.

2. A semiconductor device as claimed in claim 1, wherein the low-concentration p-type semiconductor region is formed so as to bridge between the p-type semiconductor substrate and the low-concentration n-type semiconductor region, and
   wherein the resistive element is formed outside the p-type semiconductor substrate.

3. A semiconductor device as claimed in claim 1, wherein the first high-concentration n-type semiconductor region is formed so as to bridge between the p-type semiconductor substrate and the low-concentration n-type semiconductor region, and
   wherein the resistive element is formed outside the p-type semiconductor substrate.

4. A semiconductor device as claimed in claim 3, wherein the low-concentration p-type semiconductor region is formed by a side of and contiguous with the first high-concentration n-type semiconductor region.

5. A semiconductor device as claimed in claim 3, wherein the low-concentration p-type semiconductor region is formed below and contiguous with the first high-concentration n-type semiconductor region.

6. A semiconductor device as claimed in claim 2, wherein the resistive element is formed between the first electrode and the first high-concentration n-type semiconductor region in such a way as to lie perpendicular or parallel to a direction that connects the first electrode and the first high-concentration n-type semiconductor region, the resistive element having at one end thereof a first contact that is electrically connected to the first electrode and having at another end thereof a second contact that is electrically connected to the first high-concentration n-type semiconductor region.

7. A semiconductor device as claimed in claim 3, wherein the resistive element is formed between the first electrode and the first high-concentration n-type semiconductor region in such a way as to lie perpendicular or parallel to a direction that connects the first electrode and the first high-concentration n-type semiconductor region, the resistive element having at one end thereof a first contact that is electrically connected to the first electrode and having at another end thereof a second contact that is electrically connected to the first high-concentration n-type semiconductor region.

8. A semiconductor device as claimed in claim 4, wherein the resistive element is formed between the first electrode and the first high-concentration n-type semiconductor region in such a way as to lie perpendicular or parallel to a direction that connects the first electrode and the first high-concentration n-type semiconductor region, the resistive element having at one end thereof a first contact that is electrically connected to the first electrode and having at another end thereof a second contact that is electrically connected to the first high-concentration n-type semiconductor region.

9. A semiconductor device as claimed in claim 5, wherein the resistive element is formed between the first electrode and the first high-concentration n-type semiconductor region in such a way as to lie perpendicular or parallel to a direction that connects the first electrode and the first high-concentration n-type semiconductor region, the resistive element having at one end thereof a first contact that is electrically connected to the first electrode and having at another end thereof a second contact that is electrically connected to the first high-concentration n-type semiconductor region.

10. A semiconductor device as claimed in claim 1, wherein the low-concentration p-type semiconductor region is formed so as to bridge between the p-type semiconductor substrate and the low-concentration n-type semiconductor region, and
    wherein the resistive element is formed inside the low-concentration n-type semiconductor region.

11. A semiconductor device as claimed in claim 1, wherein the first high-concentration n-type semiconductor region is formed so as to bridge between the p-type semiconductor substrate and the low-concentration n-type semiconductor region, and
    wherein the resistive element is formed inside the low-concentration n-type semiconductor region.

12. A semiconductor device as claimed in claim 11, wherein the low-concentration p-type semiconductor region is formed by a side of and contiguous with the first high-concentration n-type semiconductor region.

13. A semiconductor device as claimed in claim 11, wherein the low-concentration p-type semiconductor region is formed below and contiguous with the first high-concentration n-type semiconductor region.

* * * * *